(12) United States Patent
Makino et al.

(10) Patent No.: US 11,081,633 B2
(45) Date of Patent: Aug. 3, 2021

(54) THERMOELECTRIC GENERATION DEVICE

(71) Applicant: KELK Ltd., Kanagawa (JP)

(72) Inventors: Kazuya Makino, Kanagawa (JP);
Hirokuni Hachiuma, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 16/611,306

(22) PCT Filed: Mar. 19, 2018

(86) PCT No.: PCT/JP2018/010737
§ 371 (c)(1),
(2) Date: Nov. 6, 2019

(87) PCT Pub. No.: WO2018/207465
PCT Pub. Date: Nov. 15, 2018

(65) Prior Publication Data
US 2020/0144475 A1    May 7, 2020

(30) Foreign Application Priority Data
May 10, 2017    (JP) .............................. JP2017-093976

(51) Int. Cl.
*H01L 35/32* (2006.01)
*H01L 35/04* (2006.01)
*H01L 35/30* (2006.01)

(52) U.S. Cl.
CPC .............. *H01L 35/32* (2013.01); *H01L 35/04* (2013.01); *H01L 35/30* (2013.01)

(58) Field of Classification Search
CPC ........................... H01L 35/00–34; H01L 27/16
(Continued)

(56) References Cited

U.S. PATENT DOCUMENTS

2014/0150463 A1*  6/2014  Kiyosawa ............... H01L 35/16
                                                                    62/3.7
2018/0083175 A1*  3/2018  Hayashi .................. H01L 35/32

FOREIGN PATENT DOCUMENTS

JP    2000-232244    8/2000
JP    2010-267832    11/2010
(Continued)

OTHER PUBLICATIONS

KR Office Action in Korean Application No. 10-2019-7032927, dated Sep. 22, 2020, 7 pages (with English translation).
(Continued)

*Primary Examiner* — Bach T Dinh
(74) *Attorney, Agent, or Firm* — Fish & Richardson P.C.

(57) ABSTRACT

A thermoelectric generator includes a heat-receiving plate including a heat-receiving surface, a first heat conductor disposed on a surface of the heat-receiving plate opposite the heat-receiving surface and configured to transfer heat received by the heat-receiving plate, a thermoelectric generation module disposed on a surface of the heat conductor opposite the heat-receiving plate, a second heat conductor disposed on a surface of the thermoelectric generation module opposite the first heat conductor, and a cooling plate disposed on the thermoelectric generation module opposite the heat conductor, at least a part of an outer periphery of the first heat conductor being located inside a region corresponding to a pair of a P-type thermoelectric element and an N-type thermoelectric element disposed to an outer periphery of the thermoelectric generation module.

6 Claims, 11 Drawing Sheets

(58) Field of Classification Search
USPC .................................................. 136/200–242
See application file for complete search history.

(56) References Cited

FOREIGN PATENT DOCUMENTS

| | | | |
|---|---|---|---|
| JP | 2014-112587 | | 6/2014 |
| JP | 2016-009787 | | 1/2016 |
| JP | 2016-031966 | | 3/2016 |
| JP | 2016164910 | | 9/2016 |
| JP | WO2016199484 | * | 12/2016 |
| KR | 10-2012-0128564 | | 11/2012 |
| KR | 10-2016-0126804 | | 11/2016 |
| WO | WO 2016/199484 | | 12/2016 |

OTHER PUBLICATIONS

PCT International Preliminary Report on Patentability in International Appln. No. PCT/JP2018/010737, dated Nov. 12, 2019, 6 pages.

PCT International Search Report in Japanese Appln. No. PCT/JP2018/010737, dated May 22, 2018, 9 pages (with English translation).

Japanese Office Action in Japanese Application No. 2017-093976, dated Jan. 5, 2021, 4 pages (with English translation).

* cited by examiner

THERMOELECTRIC GENERATION DEVICE

CROSS-REFERENCE TO RELATED APPLICATIONS

This application claims priority to International Application No. PCT/JP2018/010737 filed on Mar. 19, 2018, which claims priority to Japanese Application No. 2017-093976, filed on May 10, 2017, the contents of which are incorporated herein in their entirety.

TECHNICAL FIELD

The present invention relates to a thermoelectric generator.

BACKGROUND ART

A thermoelectric generator including a heat-receiving plate, a cooling plate, and a thermoelectric generation module interposed between the heat-receiving plate and the cooling plate has been known (see, for instance, Patent Literature 1).

The above thermoelectric generator is configured to receive radiant heat with the heat-receiving plate and circulate cooling water in the cooling plate to cause temperature difference between the heat-receiving plate and the cooling plate, the thermoelectric generation module of the thermoelectric generator generating power based on the temperature difference.

Typically, the heat-receiving plate is a rectangular plate-shaped component made of iron and/or aluminum. A heat conductor such as a carbon sheet is provided on a side of the heat-receiving plate opposite a heat-receiving surface, where the thermoelectric generation module is in close contact with the heat conductor. Thus, the heat received by the heat-receiving plate is transferred to the thermoelectric generation module through the heat conductor.

CITATION LIST

Patent Literature(s)

Patent Literature 1 JP 2016-9787 A

SUMMARY OF THE INVENTION

Problem(s) to be Solved by the Invention

However, upon receiving the radiant heat, the temperature of the heat-receiving surface of the heat-receiving plate becomes high, whereas a temperature of a back surface of the heat-receiving plate becomes lower than the temperature of the heat-receiving surface, causing warpage of the heat-receiving plate in a direction for the heat-receiving surface to be arched.

The warpage of the heat-receiving plate causes compression stress applied to an end of the heat conductor to act on the thermoelectric generation module, so that ends of the thermoelectric generation module (especially soldered joint of thermoelectric generation elements at the corners) are peeled and/or disconnected.

An object of the invention is to provide a thermoelectric generator causing no damage on a thermoelectric generation module when a heat-receiving plate is heated.

Means for Solving the Problem(s)

A thermoelectric generator according to an aspect of the invention includes: a heat-receiving plate including a heat-receiving surface; a first heat conductor disposed on a surface of the heat-receiving plate opposite the heat-receiving surface, the first heat conductor transferring heat received by the heat-receiving plate; a thermoelectric generation module disposed on a surface of the first heat conductor opposite a surface where the heat-receiving plate is disposed; a second heat conductor disposed on a surface of the thermoelectric generation module opposite a surface where the first heat conductor is disposed; and a cooling plate disposed on a surface of the second heat conductor opposite a surface where the thermoelectric generation module is disposed, in which at least a part of an outer periphery of the first heat conductor is located inside a region corresponding to a pair of a P-type thermoelectric element and an N-type thermoelectric element disposed at an outer periphery of the thermoelectric generation module.

According to the above aspect the invention, at least a part of the first heat conductor is located inside the region corresponding to the pair of the P-type thermoelectric element and the N-type thermoelectric element of the thermoelectric generation module. Accordingly, a compression stress applied to an outer peripheral portion of the thermoelectric generation module can be reduced even when the heat-receiving surface of the heat-receiving plate is arched (i.e. warped upward at the center), so that the thermoelectric generation module is not damaged.

BRIEF DESCRIPTION OF DRAWING(S)

Figure 6:
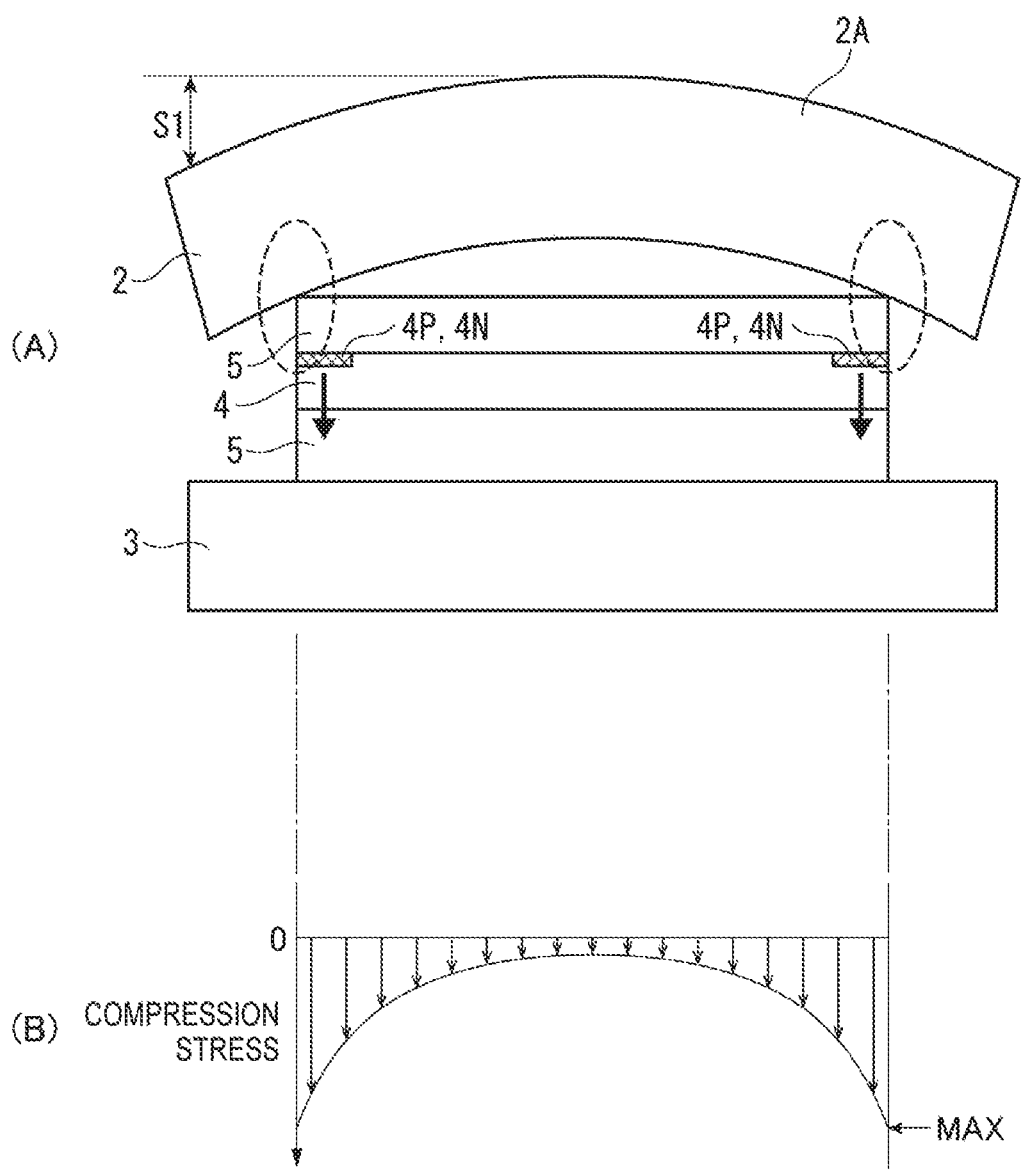

FIG. 6 includes FIGS. 6(A) and 6(B), in which FIG. 6(A) is a schematic illustration showing warpage of a heat-receiving plate and a force in a compression direction applied to a thermoelectric generation module and FIG. 6(B) is a distribution chart of a compression stress in a typical structure.

Figure 7:
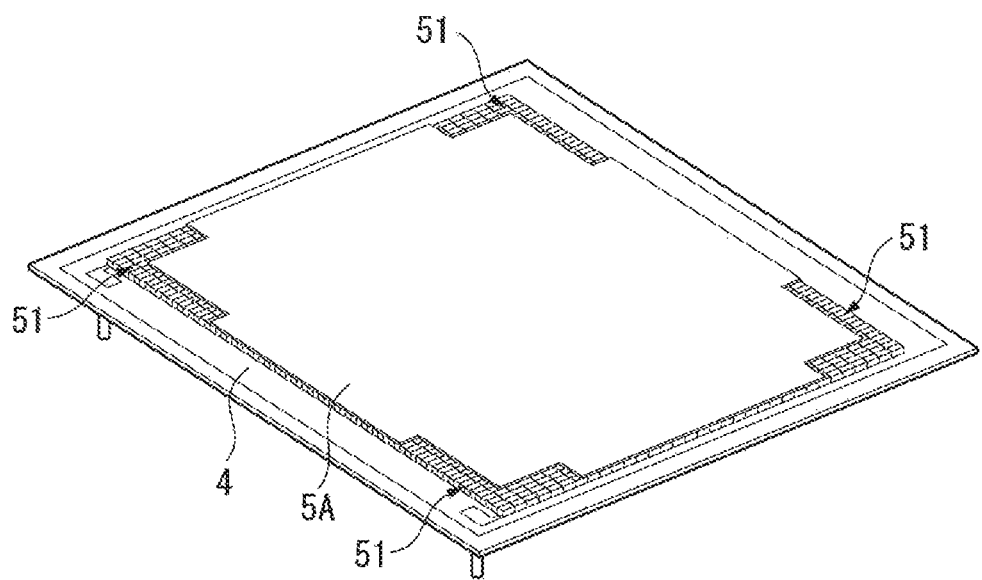

FIG. 7 is a perspective view showing a configuration of a carbon sheet in the exemplary embodiment.

Figure 8:
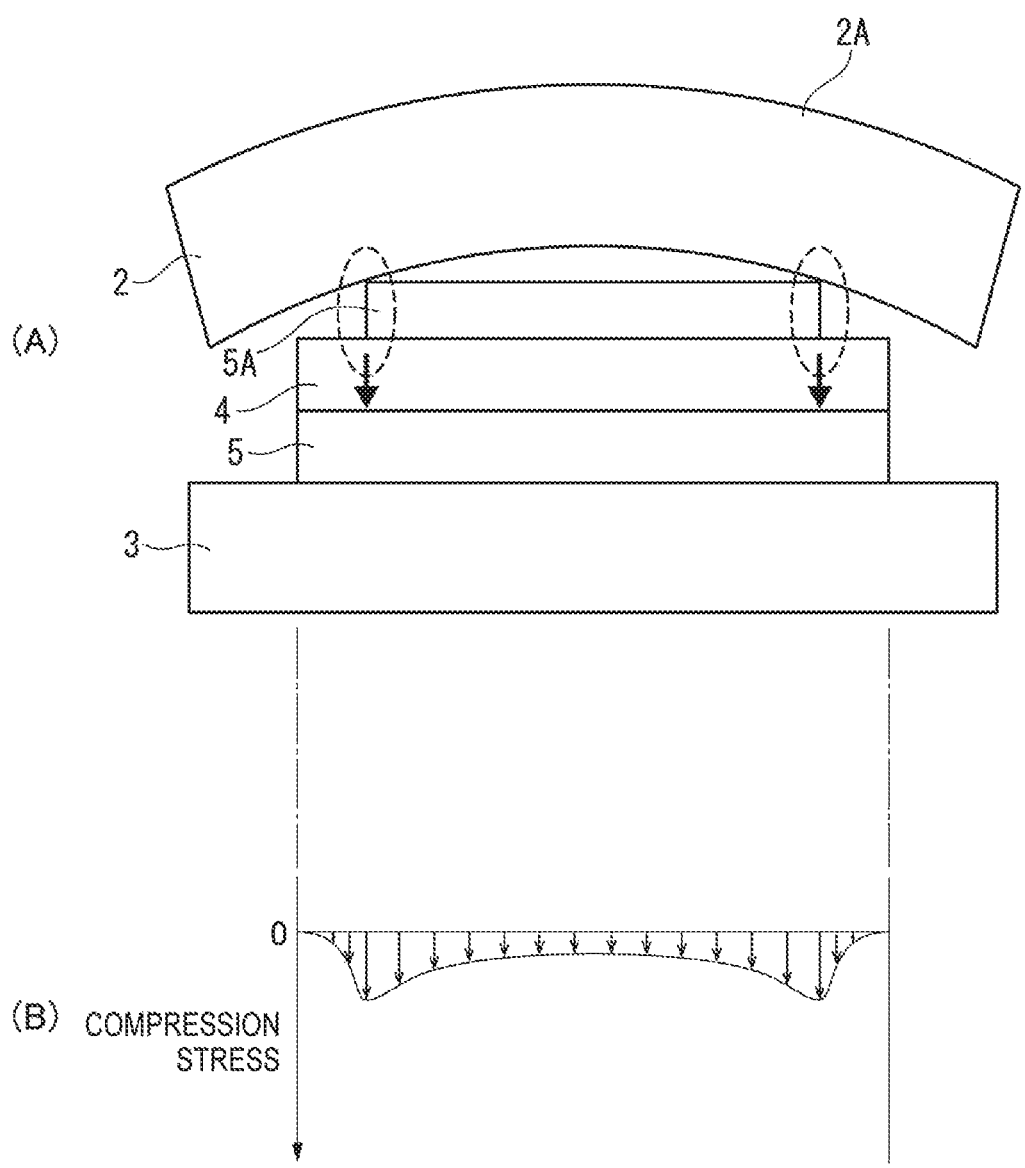

FIG. 8 includes FIGS. 8(A) and 8(B), in which FIG. 8(A) is a schematic illustration showing warpage of a heat-receiving plate and a force in a compression direction applied to the thermoelectric generation module and FIG. 8(B) is a distribution chart of a compression stress in the exemplary embodiment, respectively.

Figure 9:
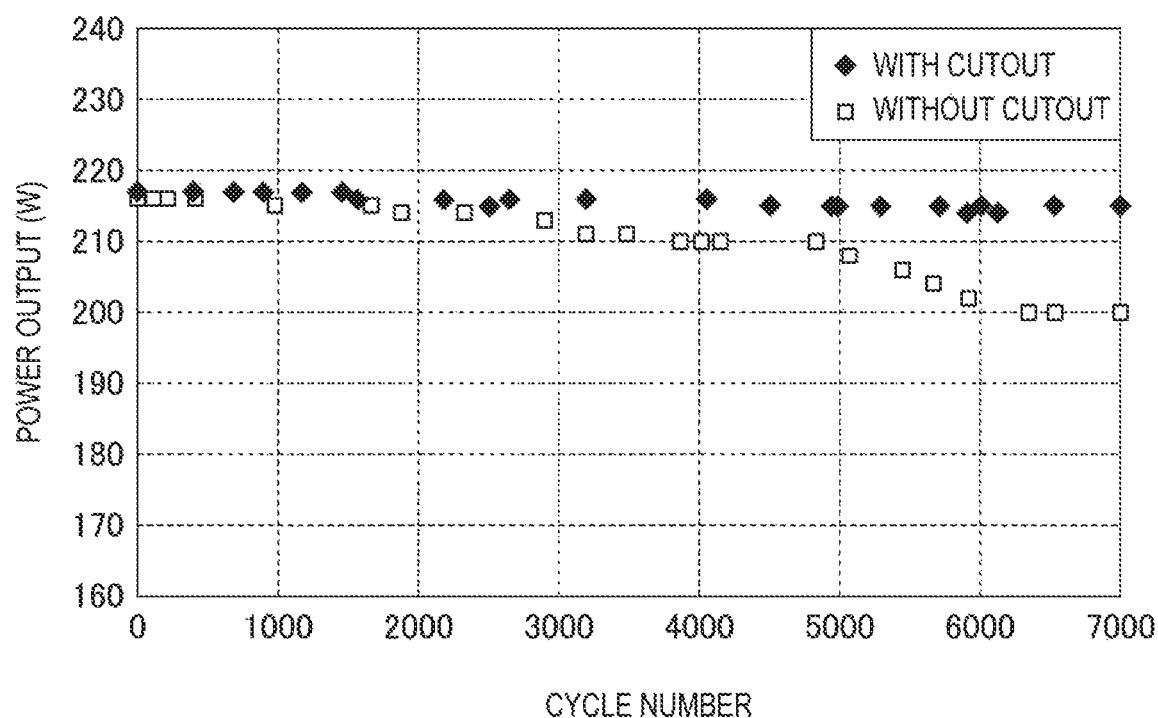

FIG. 9 is a graph showing results of a temperature cycle durability test of the thermoelectric generator according to the exemplary embodiment.

Figure 10:
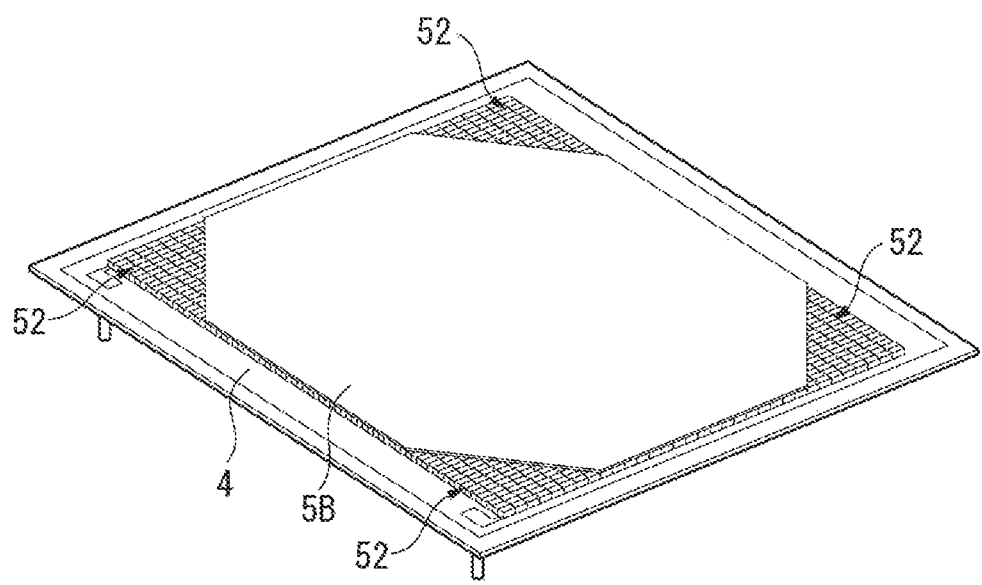

FIG. 10 is a perspective view showing a configuration of a carbon sheet according to a modification of the exemplary embodiment.

Figure 11:
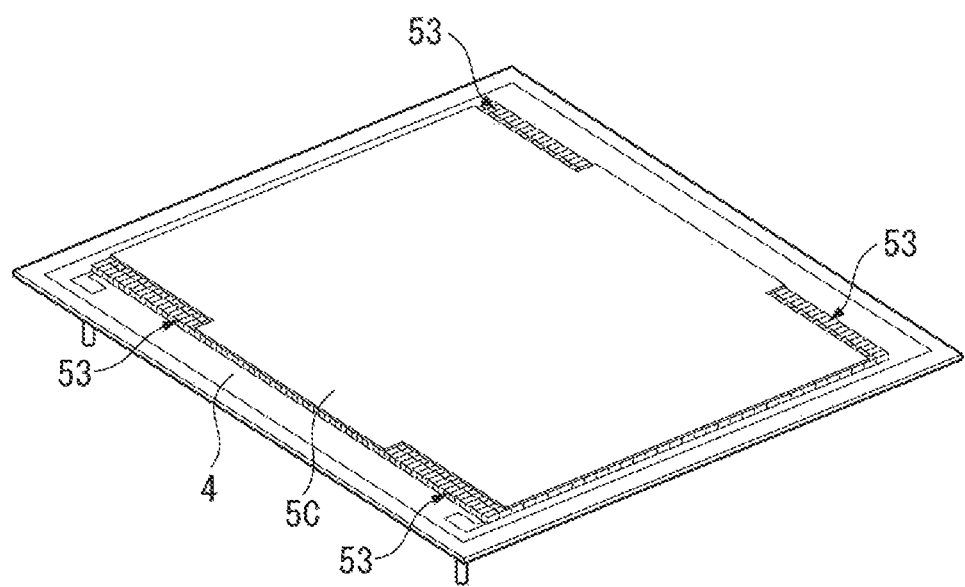

FIG. 11 is a perspective view showing a configuration of a carbon sheet according to another modification of the exemplary embodiment.

DESCRIPTION OF EMBODIMENT(S)

[1] Structure of Thermoelectric Generator 1

Figure 1:
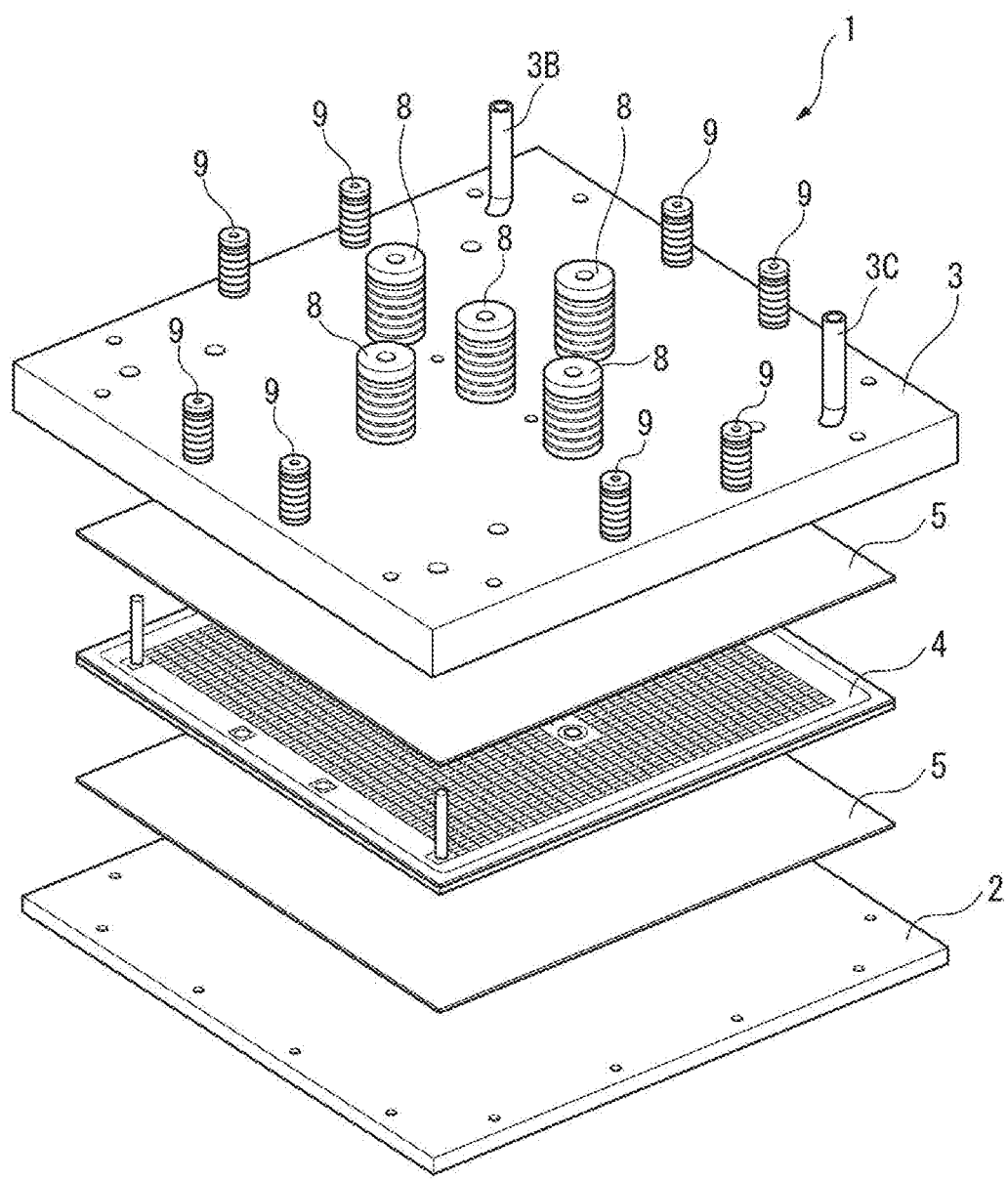
FIG. 1 is an exploded perspective view showing a structure of a thermoelectric generator according to an exemplary embodiment of the invention.
Figure 2:
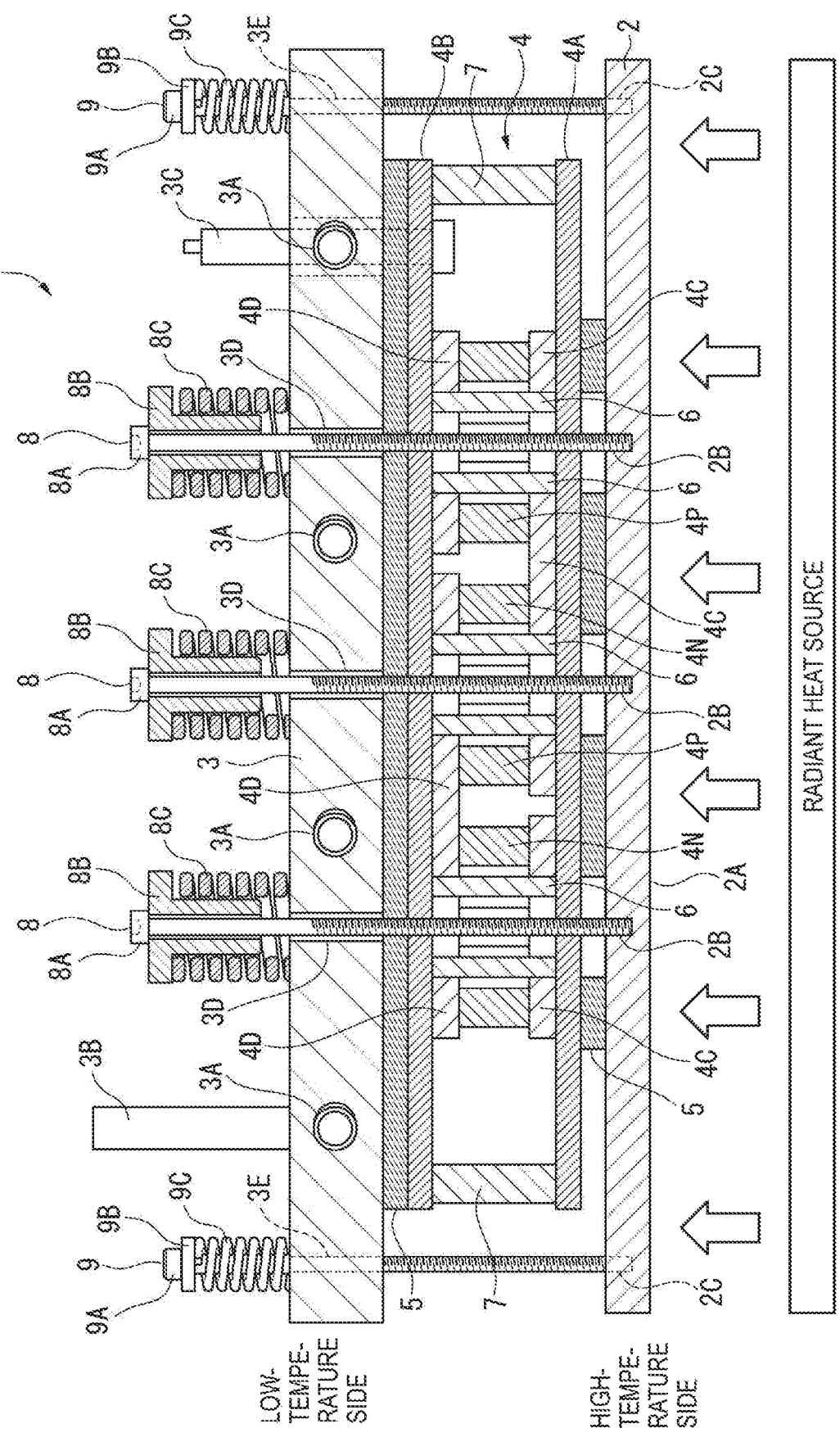
FIG. 2 is a cross-sectional view showing the structure of the thermoelectric generator according to the exemplary embodiment.

FIG. 1 is an exploded perspective view of a thermoelectric generator 1. FIG. 2 is a cross sectional view of the thermoelectric generator 1. The thermoelectric generator 1 includes a heat-receiving plate 2, a cooling plate 3, a thermoelectric generation module 4, and carbon sheets 5. The thermoelectric generator 1 is configured to receive radiant heat with the heat-receiving plate 2 and convert the heat energy into electrical energy with the thermoelectric generation module 4 based on a temperature difference between the heat-receiving plate 2 and the cooling plate 3.

The heat-receiving plate 2, which is a rectangular plate-shaped component made of, for instance, iron, copper, and aluminum, includes a heat-receiving surface 2A at a lower side thereof, the heat-receiving surface 2A being configured to be heated to approximately 250 degrees C. to 280 degrees C. by the radiant heat. As shown in FIG. 2, a plurality of female screw holes 2B, 2C are formed on a surface of the heat-receiving plate 2 opposite from the heat-receiving surface 2A.

The cooling plate 3 is a rectangular thick plate-shaped component made of, for instance, aluminum. As shown in FIG. 2, the cooling plate 3 includes therein a cooling circuit 3A for circulating coolant such as cooling water. The temperature of the entirety of the cooling plate 3 is kept approximately in a range from 20 degrees C. to 40 degrees C. by the cooling water circulating in the cooling circuit 3A.

A feed pipe 3B and a return pipe 3C for the cooling water are connected to the cooling circuit 3A. The cooling water supplied through the feed pipe 3B flows through the cooling circuit 3A to cool the cooling plate 3, and is then discharged through the return pipe 3C.

The cooling plate 3 further includes five holes 3D penetrating through top and bottom sides thereof approximately at the center thereof, and four holes 3E at outer peripheral ends thereof.

Figure 3:
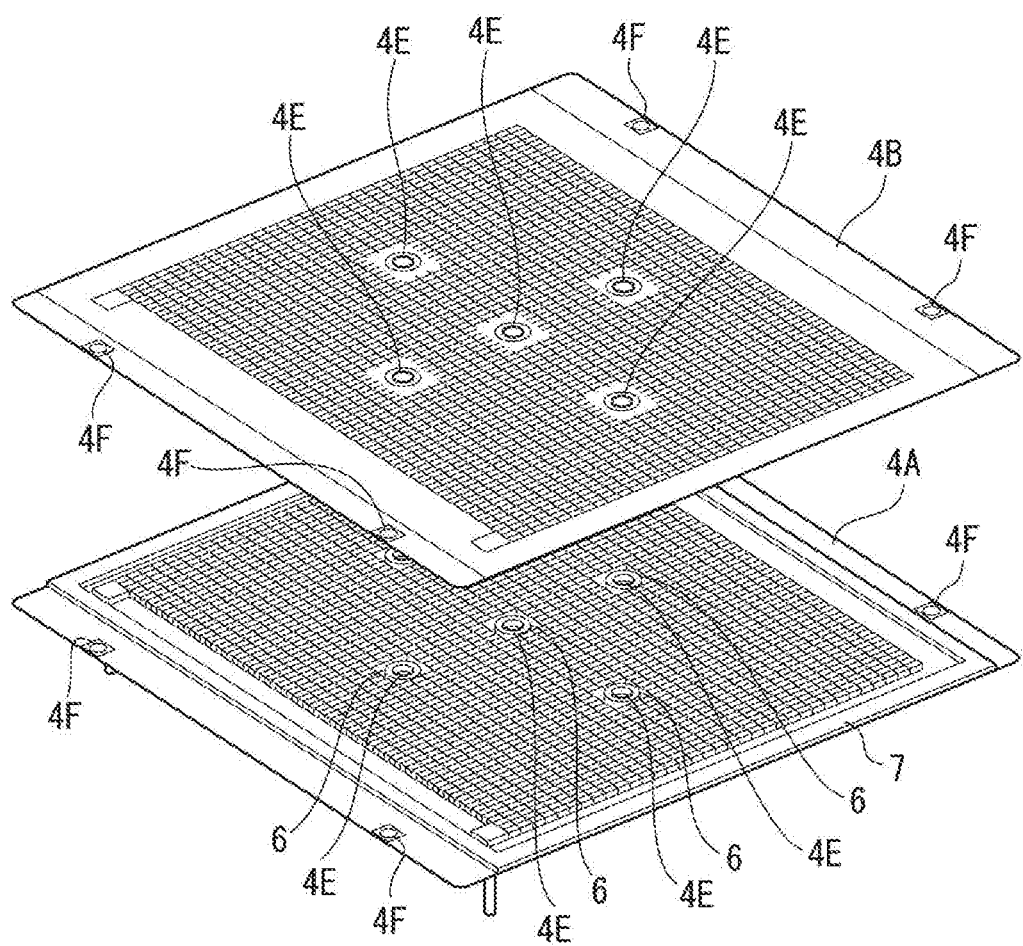
FIG. 3 is an exploded perspective view showing a structure of a thermoelectric generation module in the exemplary embodiment.

The thermoelectric generation module 4, which is disposed between the heat-receiving plate 2 and the cooling plate 3, is a rectangular component in a plan view. The thermoelectric generation module 4 includes a high-temperature-side substrate 4A; and a low-temperature-side substrate 4B as shown in FIG. 3. The high-temperature-side substrate 4A and the low-temperature-side substrate 4B, which are each in a form of a polyimide film having a surface on which electrodes are formed, are disposed with respective electrode surfaces 4C and 4D (see FIG. 2) facing each other.

Figure 4:
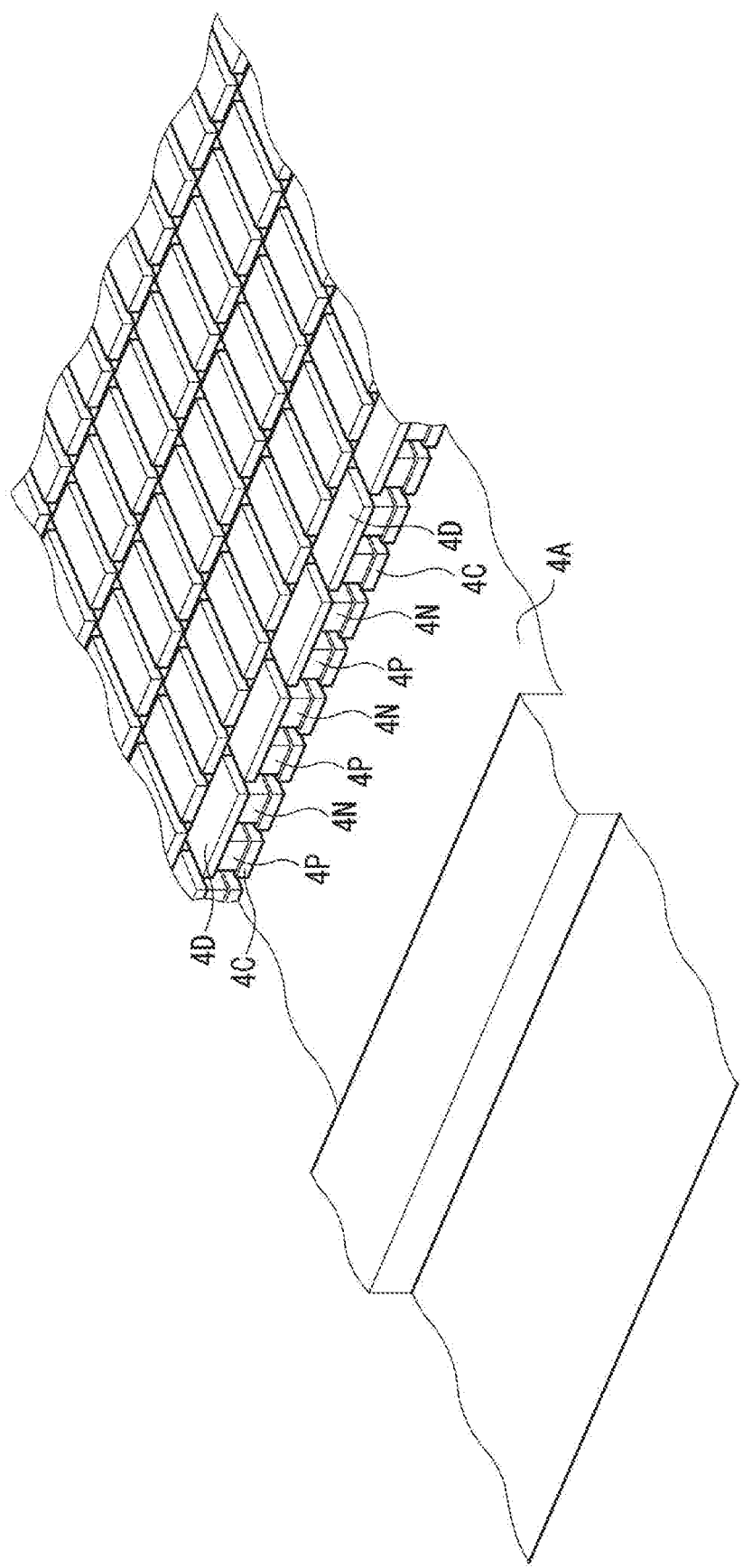
FIG. 4 is a perspective view showing a relevant part of the structure of the thermoelectric generation module in the exemplary embodiment.

As shown in FIGS. 2 and 4, a plurality of P-type thermoelectric elements 4P and N-type thermoelectric elements 4N are alternately arranged between the high-temperature-side substrate 4A and the low-temperature-side substrate 4B. These thermoelectric elements 4P, 4N provide electrical conduction between the electrode surface 4C of the high-temperature-side substrate 4A and the electrode surface 4D of the low-temperature-side substrate 4B. The electrode surface 4C of the high-temperature-side substrate 4A and the electrode surface 4D of the low-temperature-side substrate 4B are soldered to end surfaces of the thermoelectric elements 4P and 4N.

As shown in FIG. 3, each of the high-temperature-side substrate 4A and the low-temperature-side substrate 4B has five holes 4E at the center and four holes 4F at outer peripheral ends. Ring-shaped inner sealing frames 6 are provided around respective holes 4E. A rectangular peripheral sealing frame 7 is provided along a periphery of the low-temperature-side substrate 4B. The inner sealing frames 6 and the peripheral sealing frame 7 are formed of a metal material such as iron, copper, and aluminum.

As shown in FIG. 1, the carbon sheets 5 are each interposed between the heat-receiving plate 2 and the high-temperature-side substrate 4A and between the cooling plate 3 and the low-temperature-side substrate 4B. The carbon sheets 5 thus serve as heat conductors for transferring the heat received by the heat-receiving plate 2 to the high-temperature-side substrate 4A and transferring the heat of the low-temperature-side substrate 4B to the cooling plate 3.

Each of the carbon sheets 5 is in a form of a rectangular sheet material whose outer periphery meets an inner periphery of the peripheral sealing frame 7. The carbon sheet 5 near the high-temperature-side substrate 4A is kept in non-contact with a part of the high-temperature-side substrate 4A corresponding in position to the peripheral sealing frame 7. In other words, an air layer between the carbon sheet 5 and the part of the high-temperature-side substrate 4A corresponding in position to the peripheral sealing frame 7 functions as a heat insulating layer.

Each of the carbon sheets 5 also has five holes at a central part in conformity with the arrangement of the inner sealing frames 6. Each of the holes is larger than an outline of each of the annular inner sealing frames 6. The carbon sheet 5 near the high-temperature-side substrate 4A is kept in non-contact with parts of the high-temperature-side substrate 4A corresponding in position to the annular inner sealing frames 6. An air layer between the carbon sheet 5 and each of the parts of the high-temperature-side substrate 4A corresponding in position to the annular inner sealing frames 6 functions as a heat insulating layer.

The heat-receiving plate 2, the cooling plate 3, the thermoelectric generation module 4, and the carbon sheets 5 in the above arrangement are integrated using five first fasteners 8 and eight second fasteners 9.

As shown in FIG. 2, each of the first fasteners 8 includes a bolt 8A, a receiver 8B, and a coil spring 8C. The bolt 8A is inserted through corresponding one of the holes 3D of the cooling plate 3, corresponding one of the holes 4E of the thermoelectric generation module 4, and corresponding one of the holes of the carbon sheets 5 in sequence, to be screwed into corresponding one of the female screw holes 2B of the heat-receiving plate 2.

Each of the receivers 8B, which is a metallic cylindrical component receiving corresponding one of the bolts 8A, includes a flange at an end thereof.

When the bolt 8A is screwed into corresponding one of the female screw holes 2B of the heat-receiving plate 2, the coil spring 8C, which has been put on an outer circumferential portion of the receiver 8B, is compressed by the flange of the receiver 8B in an insertion direction to bias the cooling plate 3 toward the heat-receiving plate 2.

The second fasteners 9, which are components for fastening the heat-receiving plate 2 and the cooling plate 3 at outer peripheries thereof, are configured to be substantially the same as the first fasteners 8 and each include a bolt 9A, a receiver 9B, and a coil spring 9C.

Figure 5:
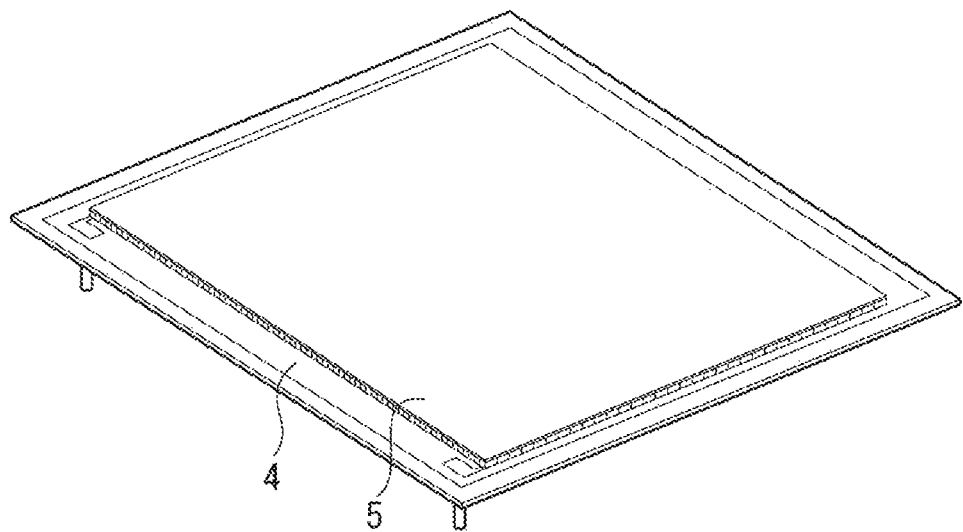
FIG. 5 is a perspective view showing a configuration of a typical carbon sheet.

[2] Problem Associated With Typical Arrangement and Structure According to the Exemplary Embodiment In the above-described thermoelectric generator 1, the carbon sheets 5 serving as the heat-conductive layers are of the same (rectangular) shape as the planar shape of the thermoelectric elements 4P, 4N of the thermoelectric generation module 4, and are in close contact with the thermoelectric elements 4P, 4N as shown in FIG. 5.

When the heat-receiving plate 2 is heated in this state, the temperature of the heat-receiving surface 2A of the heat-receiving plate 2, which is directly heated, becomes approximately 250 degrees C., whereas the temperature of the back surface of the heat-receiving plate 2 is lower than the temperature of the heat-receiving surface 2A (e.g. approximately 245 degrees C.). Thus, as with the relative increase in the thermal expansion of the heat-receiving surface 2A, the heat-receiving surface 2A of the heat-receiving plate 2 is arched as shown in FIG. 6(A). Though the warpage is approximately 0.2 mm, compression force is caused on the back surface of the heat-receiving plate 2.

The compression stress, which acts on the thermoelectric generation module 4 through the carbon sheet 5, is largest at the ends of the thermoelectric generation module 4 as shown in FIG. 6(B), causing peeling of the soldered joint of the thermoelectric elements 4P, 4N of the thermoelectric generation module 4.

Accordingly, in the exemplary embodiment, cutouts 51, which are L-shaped in a plan view, are formed at corners of the rectangle of the carbon sheet 5A (first heat conductor) as shown in FIG. 7, whereby a part of the outer periphery of the carbon sheet 5A is located inside a region corresponding to one pair of the P-type thermoelectric element 4P and the N-type thermoelectric element 4N disposed at the outer periphery of the thermoelectric generation module 4. It should be noted that the carbon sheet 5 (second heat conductor) near the cooling plate 3 has no cutout at the corners thereof.

As described above, the cutouts 51 of the carbon sheet 5A allows at least a part of the outer periphery of the carbon sheet 5A to be located inside the region corresponding to one pair of the P-type thermoelectric element 4P and the N-type thermoelectric element 4N disposed at the outer periphery of the thermoelectric generation module 4, as shown in FIG. 8(A). Even when a force in the compression direction acts on the back surface of the heat-receiving plate 2 in response to the warpage caused on the heat-receiving plate 2 due to the heat applied on the heat-receiving plate 2, the compression stress acting on the ends of the thermoelectric generation module 4 is reduced as shown in FIG. 6(B). Accordingly, the soldered joint between the thermoelectric elements 4P, 4N at the ends of the thermoelectric generation module 4 is not peeled.

The results of a temperature cycle durability test for the thermoelectric generator 1 using the typical carbon sheets 5 and the thermoelectric generator 1 using the carbon sheet 5A of the exemplary embodiment are shown in FIG. 9. It should be noted that, in the temperature cycle durability test, the heat-receiving plate 2 was subjected to heating in a cyclic temperature change ranging from 50 degrees C. to 250 degrees C.

When the typical carbon sheets 5 were used (i.e. without the cutouts), the output of the thermoelectric generator 1 was declined approximately by 7% after 7000 cycles of the temperature change.

The approximately 7% decline in the output was found to be attributable to the peeling at the soldered joint of the P-type thermoelectric element 4P or the N-type thermoelectric element 4N at the four corners of the thermoelectric generation module 4, resulting in an increase in the electric resistance of the thermoelectric element. The electric resistances of all of the four thermoelectric elements where the peeling occurred were 20 times or more times as large as an initial value.

In contrast, when the carbon sheet 5A according to the exemplary embodiment was used (i.e. with the cutouts), the output of the thermoelectric generator 1 was declined approximately by 1% after 7000 cycles of the temperature change.

The electric resistance of each of the P-type thermoelectric elements 4P and N-type thermoelectric elements 4N was not increased, and no peeling occurred in the soldered joint at the corners of the thermoelectric generation module 4. It is believed that the approximately 1% decline in the entirety of the device is attributable to a measurement error and the like.

Accordingly, it was confirmed that the soldered joint in the thermoelectric elements 4P, 4N at the ends of the thermoelectric generation module 4 are not damaged when the cutouts 51 are formed in the carbon sheet 5A so that the outer periphery of the carbon sheet 5A is located inside the region corresponding to one pair of the P-type thermoelectric element 4P and the N-type thermoelectric element 4N disposed on the outer periphery of the thermoelectric generation module 4.

The cutouts 51 formed in the carbon sheet 5A thus reduce the compression force acting on the thermoelectric generation module 4. Accordingly, increase in the upward warpage of the heat-receiving plate 2 is acceptable. Thus, the power generation by the thermoelectric generation module 4 can be increased by raising the temperature of the heat-receiving plate 2 to enlarge the temperature difference between the heat-receiving plate 2 and the cooling plate 3.

[3] Modification(s) of Embodiment(s)

It should be noted that the scope of the invention is not limited to the above-described, but encompasses the following modifications.

Though the L-shaped (in a plan view) cutouts 51 are formed at the corners of the carbon sheet 5A in the exemplary embodiment, the invention is not limited thereto.

For instance, cutouts 52 provided by diagonally cutting corners of a carbon sheet 5B as shown in FIG. 10 are provided in some embodiments.

Further, cutouts 53 provided by cutting a predetermined area of each of corners of a carbon sheet 5C in a rectangle as shown in FIG. 11 are provided in some embodiments.

Further, the cutouts are not necessarily provided at the corners of the carbon sheets 5A, 5B, 5C, but are provided at a part of sides of the rectangle of the carbon sheets 5A, 5B, 5C. In other words, the cutout(s) may be formed at any position at which the compression force caused by the deformation of the heat-receiving plate 2 is applied.

In addition, the structure and the like in implementing the invention may be designed in any manner as long as an object of the invention is achievable.

The invention claimed is:
1. A thermoelectric generator comprising:
a heat-receiving plate comprising a heat-receiving surface;
a first heat conductor disposed on a surface of the heat-receiving plate opposite the heat-receiving surface, the first heat conductor transferring heat received by the heat-receiving plate;
a thermoelectric generation module disposed on a surface of the first heat conductor opposite a surface where the heat-receiving plate is disposed, the thermoelectric generation module having a rectangular shape in a plan view;

a second heat conductor disposed on a surface of the thermoelectric generation module opposite a surface where the first heat conductor is disposed; and a cooling plate disposed on a surface of the second heat conductor opposite a surface where the thermoelectric generation module is disposed, wherein the first heat conductor comprises:
- a side portion that extends along each side of the thermoelectric generation module and that covers a region corresponding to a pair of a P-type thermoelectric element and an N-type thermoelectric element that are disposed at an outer periphery of the thermoelectric generation module; and
- at least one cutout that is defined at a position corresponding to at least one corner of the thermoelectric generation module and recessed inward relative to the region corresponding to the pair of the P-type thermoelectric element and the N-type thermoelectric element.

2. The thermoelectric generator according to claim 1, wherein the at least one cutout comprises cutouts that are defined at four corners of the first heat conductor.

3. The thermoelectric generator according to claim 1, wherein the at least one cutout extends from the at least one corner of the first heat conductor to the side portion that extends along one side of the thermoelectric generation module.

4. The thermoelectric generator according to claim 1, wherein the at least one cutout extends from the at least one corner of the first heat conductor to the side portions that extend along two sides of the thermoelectric generation module.

5. The thermoelectric generator according to claim 1, wherein the at least one cutout extends from the at least one corner of the first heat conductor in a diagonal direction of the rectangular shape.

6. The thermoelectric generator according to claim 1, wherein the at least one cutout is inclined with respect to the side portion of the first heat conductor.

\* \* \* \* \*